United States Patent [19]

Hernandez

[11] Patent Number: 5,065,284
[45] Date of Patent: * Nov. 12, 1991

[54] MULTILAYER PRINTED WIRING BOARD

[75] Inventor: Jorge M. Hernandez, Mesa, Ariz.

[73] Assignee: Rogers Corporation, Rogers, Conn.

[*] Notice: The portion of the term of this patent subsequent to Mar. 13, 2007 has been disclaimed.

[21] Appl. No.: 291,531

[22] Filed: Dec. 29, 1988

Related U.S. Application Data

[63] Continuation-in-part of Ser. No. 226,619, Aug. 1, 1988.

[51] Int. Cl.$^5$ .............................................. H05K 1/11
[52] U.S. Cl. ..................................... 361/414; 174/261
[58] Field of Search ................. 361/412, 414; 174/261, 174/266, 72 B; 428/901

[56] References Cited

U.S. PATENT DOCUMENTS

| | | | |
|---|---|---|---|
| 3,932,932 | 1/1976 | Goodman | 361/414 X |
| 4,388,136 | 6/1983 | Huie et al. | 174/261 X |
| 4,908,258 | 3/1990 | Hernandez | 361/398 X |

Primary Examiner—Leo P. Picard
Assistant Examiner—Paramita Ghosh
Attorney, Agent, or Firm—Fishman, Dionne & Cantor

[57] ABSTRACT

A multilayer printed wiring board is presented for surface mounting or through hole technology, which includes one or more layers of a high capacitance flexible dielectric sheet material. The dielectric sheet is comprised of a monolayer of multilayer or single layer high dielectric constant (e.g. ceramic) chips or pellets of relatively small area and thickness which are arranged in a planar array. These high dielectric constant chips are spaced apart by a small distance. The spaces between the chips are then filled with a flexible polymer/adhesive to define a cohesive sheet with the polymer binding the array of high dielectric (e.g. ceramic) chips together. Next, the opposite planar surfaces of the array (including the polymer) are electroless plated or electroded by vacuum metal deposition, or sputtering, to define opposed metallized surfaces. The board of the present invention alleviates the need for decoupling capacitors, thus resulting in significant, space savings on the board surface.

13 Claims, 6 Drawing Sheets

MULTILAYER PRINTED WIRING BOARD

CROSS-REFERENCE TO RELATED APPLICATION

This is a continuation-in-part of U.S. application Ser. No. 226,619 filed Aug. 1, 1988.

BACKGROUND OF THE INVENTION

This invention relates generally to a multilayer printed wiring board, either for surface mounting or through hole technology. More, particularly this invention relates to a multilayer printed wiring board which incorporates a high dielectric constant sheet material.

It will be appreciated that there is an ever increasing need for a reliable, flexible high dielectric material which may be used for a variety of applications in electronic circuitry design and manufacture. Presently, flexible high dielectric materials of this type are manufactured by mixing small particles (e.g. 1-3 microns) of a high dielectric constant material into a flexible polymeric matrix. Surprisingly, the resultant effective dielectric constant of the dielectric impregnated polymer is relatively low. For example, the dielectric constant of a Z5U $BaTiO_3$ is in the range of 10,000 to 12,000. However, when such Barium Titanate is mixed with a flexible polymer such as polyimide, polyester, polyetherimide and like materials, the effective dielectric constant relizable is only on the order of 20 to 40 (depending on the loading ratio of the dielectric in the polymer).

It will be further appreciated that a need exists for a multilayer printed circuit board which provides power distribution free of the need for decoupling capacitors. This is because decoupling capacitors take up space on the surface of the board. This space can be used for integrated circuit chips or other functional components thereby increasing the amount of functional area on the board. Attempts have been made to construct a board which provides both power distribution and decoupling. One prior art attempt involves reducing the thickness of the dielectric layer between the voltage and ground planes. This attempt has proven unsatisfactory because of manufacturing problems. Because of the reduced thickness of the dielectric layer, pin holes are formed in it thereby resulting in electrical shorting of the circuit board. Also, the capacitance of the board varies with changes in the thickness of the dielectric layer. Another prior art board uses as a dielectric a suitable polymer filled with a high dielectric constant material such as barium titanate. The filled polymer is placed between the voltage and ground planes to create a capacitor effect. This prior art multilayer board has proven ineffective because the filled polymer has an effective dielectric constant of no more than about 80-100, which is too low for adequate results.

SUMMARY OF THE INVENTION

The above-discussed and other problems and deficiencies of the prior art are overcome or alleviated by the multilayer circuit board of the present invention which incorporates a high dielectric constant flexible sheet material. In accordance with the present invention, this high capacitance flexible dielectric material is comprised of a monolayer of multilayer or single layer high dielectric constant (e.g. ceramic) chips or pellets of relatively small area and thickness which are arranged in a planar array. These high dielectric constant chips are spaced apart by a small distance. The spaces between the chips are then filled with a flexible polymer/adhesive to define a cohesive sheet with the polymer binding the array of high dielectric constant (e.g. ceramic) chips together. Next, the opposite planar surfaces of the array (including the polymer) are metallized (e.g. electroless plated or metallized by vacuum deposition, sputtering, etc.) to define opposed metallized surfaces. The end result is a relatively flexible high capacitance dielectric film or sheet material which is drillable, platable, printable, etchable, laminable and reliable.

In a preferred embodiment, the small high dielectric chips are cylindrical in shape. However, the chips may be any other suitable shape including rectangular. Also, the high dielectric constant chips may include punches or cut-outs to improve mechanical adhesion between the chips and the polymeric binding material.

Also as mentioned above, rather than using high dielectric constant (ceramic) pellets, the discrete high dielectric monolayer may be comprised of an array of multilayer ceramic chips such as those disclosed at FIGS. 4 and 10 in U.S. Pat. No. 4,748,537 and at FIGS. 11-16 in U.S. Pat. No. 4,706,162, all of which are assigned to the assignee hereof and incorporated herein by reference.

The high capacitance flexible dielectric sheet of the present invention may be used in a large number of applications in the electronic circuitry design and manufacturing fields. For example, the high dielectric flexible sheet may be used for forming multilayer circuit boards, or in the manufacture of decoupling capacitors or bus bars.

The multilayer printed circuit board of the present invention provides a circuit board which both decouples and distributes power. The multilayer printed circuit board of the present invention may be comprised of multiple layers of insulative material with the central layer being comprised of the high dielectric constant flexible sheet. The metallized surfaces of the high dielectric constant sheet act as the voltage and ground planes of the circuit board. On the surface of the board is provided a printed metallic pattern which defines the circuit. Because this board can be used free of decoupling capacitors, it provides the user with a higher packing density of functional components on the surface of the board.

The above discussed and other features and advantages of the present invention will be appreciated and understood by those of ordinary skill in the art from the following detailed description and drawing.

BRIEF DESCRIPTION OF THE DRAWINGS

Referring now to the drawings, wherein like elements are numbered alike in the several FIGURES.

DESCRIPTION OF THE PREFERRED EMBODIMENT

Figure 1:
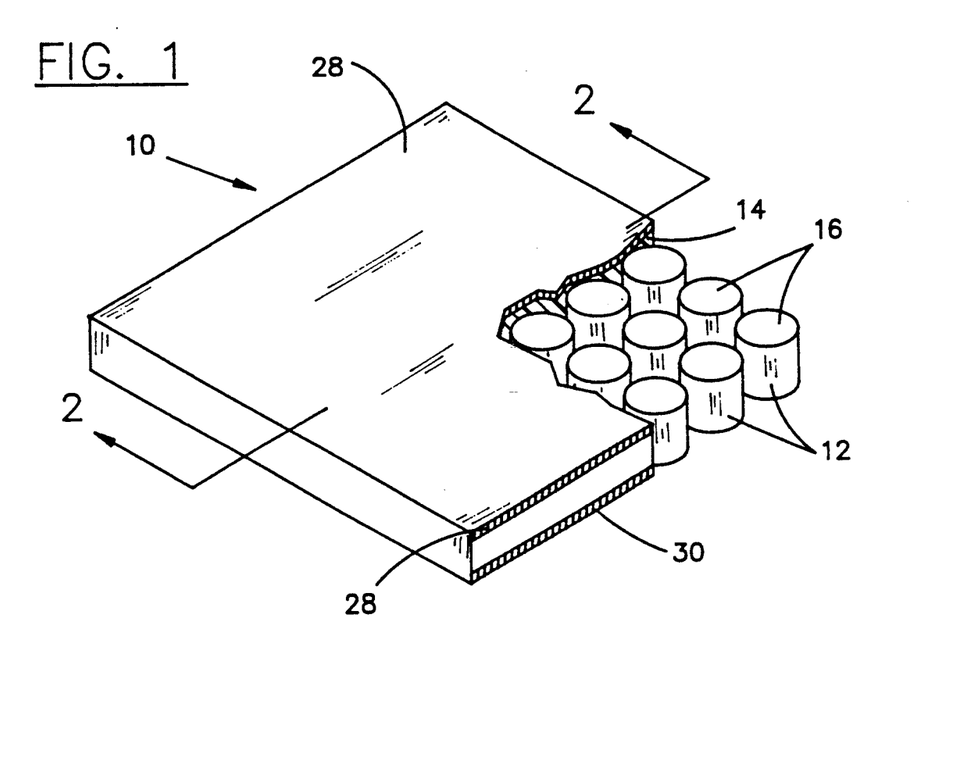
FIG. 1 is a perspective view of the high dielectric flexible sheet material of the present invention.
Figure 2:
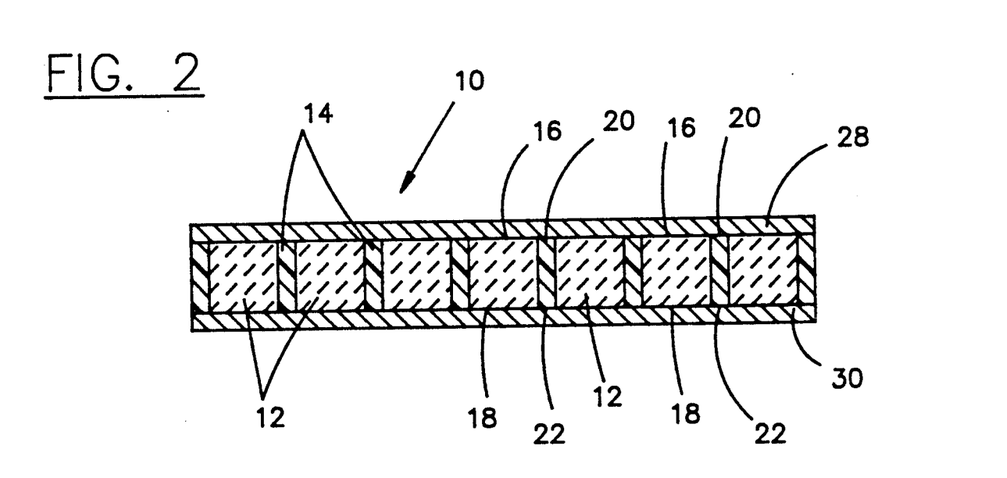
FIG. 2 is a cross-sectional elevation view along the line 2—2 of FIG. 1.

This invention relates to a multilayer circuit board incorporating a high dielectric constant sheet material. Referring first to FIGS. 1 and 2, the high dielectric constant flexible polymeric sheet material is shown generally at 10. Flexible sheet 10 is comprised of a monolayer of high dielectric constant pellets or chips 12 which are of relatively small area and thickness and are arranged in a planar array. The chips are separated from each other by a small distance to define spaces therebetween. The spaces between the chips 12 are filled with a suitable polymeric material 14. Polymeric material 14 will act as a binder to hold the array of high dielectric constant pellets 12 together. Significantly, polymeric material 14 will contact only the sides of pellets 12 and will be out of contact with the top and bottom surfaces 16 and 18 of each pellet 12. This will result in both end surfaces 16, 18 of high dielectric constant pellets 12 and end surfaces 20, 22 of polymeric binder 14 being exposed. Next, these opposed and exposed surfaces (comprised of surfaces 16 and 20 on the one hand and surfaces 18 and 22 on the other hand) of the pellet array and polymer are metallized to define a thin (e.g. about 10–50 micro inches) metallized layer 24 and 26. These thin metallized layers 24 and 26 may then be plated up to higher thicknesses (e.g. about 1–2 mils) by well known electroplating techniques to define layers 28 and 30. The thin metallized layers may be produced using any known method including by electroless plating or by vapor deposition techniques including vacuum deposition, sputtering, etc.

The material used to produce high dielectric constant pellets 12 may be any suitable high dielectric constant material and is preferably a high dielectric constant ceramic material such as $BaTiO_3$. In addition, other known high dielectric ceramic materials may be utilized including lead magnesium niobate, iron tungsten niobate, etc. It will be appreciated that by "high" dielectric constant, it is meant dielectric constants of over about 10,000. As mentioned, the pellets are relatively small and are preferably cylindrical in shape having a height of 0.015" and a diameter of 0.020". If a ceramic is used, the pellets should be fully sintered prior to being bonded together by the polymer.

Figures 5A, 5B, 5C:
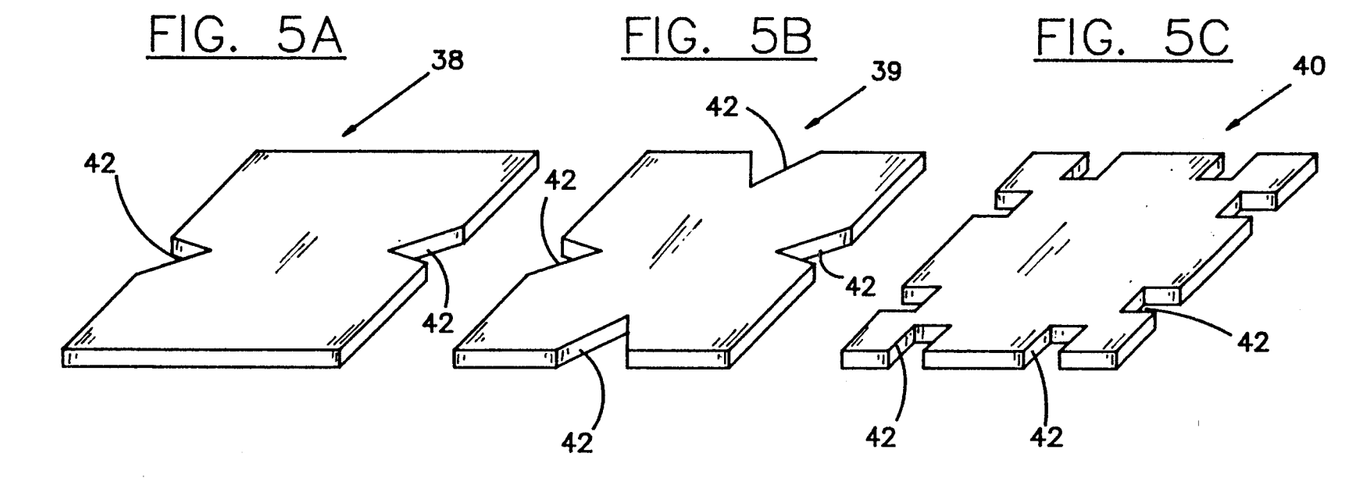
FIGS. 5A, 5B and 5C are perspective views of alternative high dielectric constant pellet configurations which may be used in accordance with the present invention.

Of course, while cylindrical configurations for the array of pellets 12 are preferred, any other suitably shaped high dielectric constant pellet may be used. For example, in FIG. 3, a flexible high capacitance sheet is shown at 32 incorporating an array of rectangularly shaped pellets 34 in a polymer matrix 36. Also, in FIGS. 5A–5C, square shaped pellets are shown at 38, 39 and 40 respectively which are provided with from two through eight slots or grooves 42. It will be appreciated that these grooves or slots will provide a stronger mechanical bond between the polymeric binder and the pellet.

The pellet array is impregnated with a suitable polymer which may be a either a flexible thermoplastic or a flexibilized thermoset (epoxy, polyetherimide, polyester, etc.) to give the array mechanical strength and electrical insulating stability with temperature, moisture, solvents, etc. The polymeric material should be a high temperature (approximately 350° F.) polymer which is somewhat flexible and has a dielectric constant of between about 4–9. Preferred materials include polyetherimides, polyimides, polyesters and epoxies. It will be appreciated that the flexibility is necessary to preclude cracking of the sheet under stress.

Preferably, the dielectric sheet is electroless plated with copper or nickel.

The resultant sheet material will have an effective high dielectric constant of better than 1,000, a small thickness (approximately 0.005"–0.015"), will be flexible, will be metallized on both sides and will be drillable and platable.

EXAMPLES

A mathematical analysis can be made to determine the effective dielectric constant of the combined pellet array and polymeric matrix.

EXAMPLE 1

For example, using a dielectric sheet as depicted in FIGS. 1 and 2 which incorporates cylindrical pellets measuring 0.020" in diameter by 0.010" in length; and assuming a sheet of one square inch having a total of about 2,500 cylinders. Capacitance of the dielectric sheet is determined using the following formula:

$$C = \epsilon \times (\epsilon_o) \times (a/D) \times (N) \qquad (1)$$

where
 C = total capacitance
 $\epsilon$ = relative permitivity of the dielectric
 $\epsilon_o$ = permitivity of free space
 a = area of electroded part of dielectric
 D = distance between two electrodes of dielectric
 N = number of dielectric pellets Assuming that the pellets are made of a Z5U dielectric with a dielectric constant of 15,000, then the capacitance of such an array would be:
 $\epsilon = 15,000$
 $\epsilon_o = 8.85 \times 10^{-12}$
 $a = 2.827 \times 10^{-7} \, m^2$
 $D = 3 \times 10^{-4} \, m$
 $N = 2500$
Thus:

$$C = 15,000 \times 8.85 \times 10^{-12} \times \frac{2.827 \times 10^{-7}}{3 \times 10^{-4}} \times 2500$$

or
 C = 312 nF/sq.-in. or 312,500 pF/sq.in.

If an X7R dielectric (with a dielectric constant of 4500) is utilized, then using the above equation (1), the capacitance per square inch would be about 93.6 nF/sq.in.

EXAMPLE 2

Figure 3:
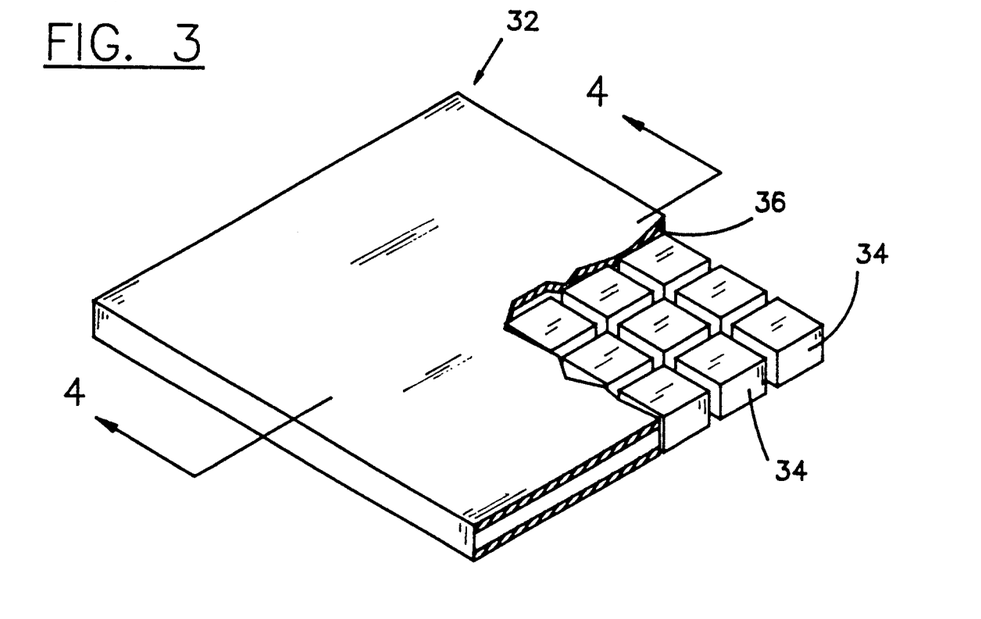
FIG. 3 is a perspective view, similar to FIG. 1, of a different embodiment of the present invention.
Figure 4:
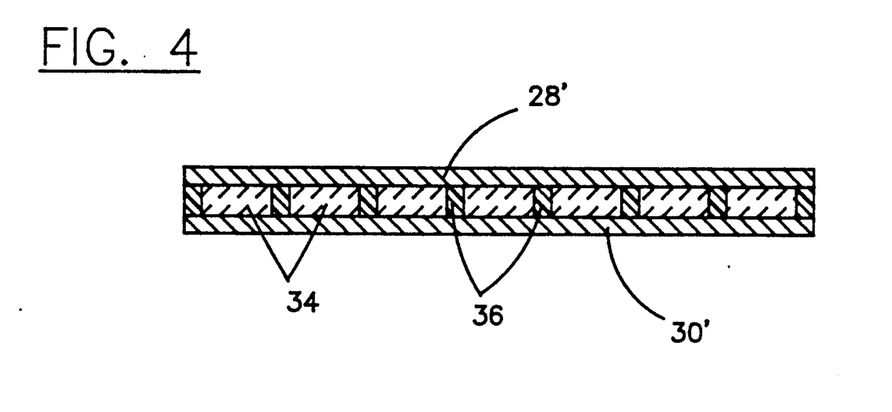
FIG. 4 is a cross-sectional elevation view along the line 4—4 of FIG. 3.

If a rectangular ceramic pellet (such as shown in FIG. 3) made from lead magnesium niobate (having a dielectric constant of 17,000) is selected with each pellet having surface area dimensions of 0.20"×0.30" and 0.015" in thickness; and with the array of pellets being spaced apart 0.020", then, using the same calculations as in Example 1, the capacitance will be 224 nF/sq.in. Alternately, if an internal boundary layer dielectric is selected with a dielectric constant of approximately 60,000 [such as $(Sr_{0.4} Ba_{0.6}) TiO_3+10H_2O$] then the effective capacitance per square inch will be equal to 759 n F./sq.in.

Figure 6:
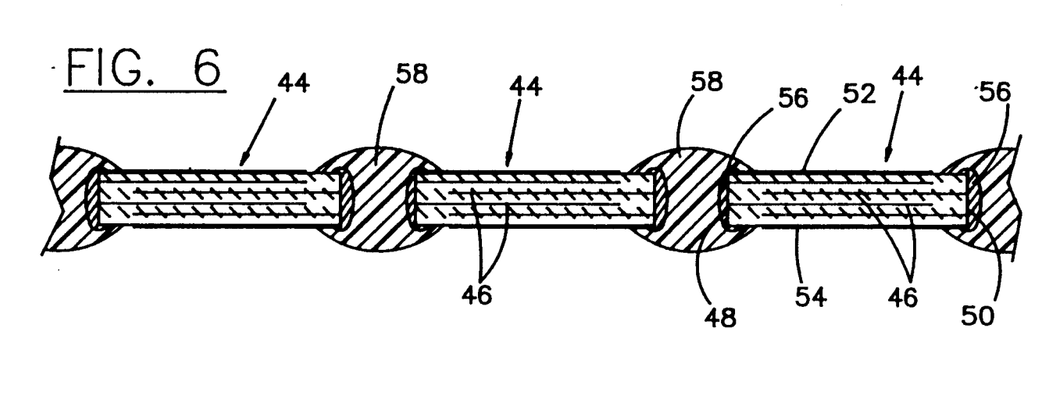
FIG. 6 is a cross-sectional elevation view of still another embodiment of the present invention utilizing multilayer capacitive elements.
Figure 7:
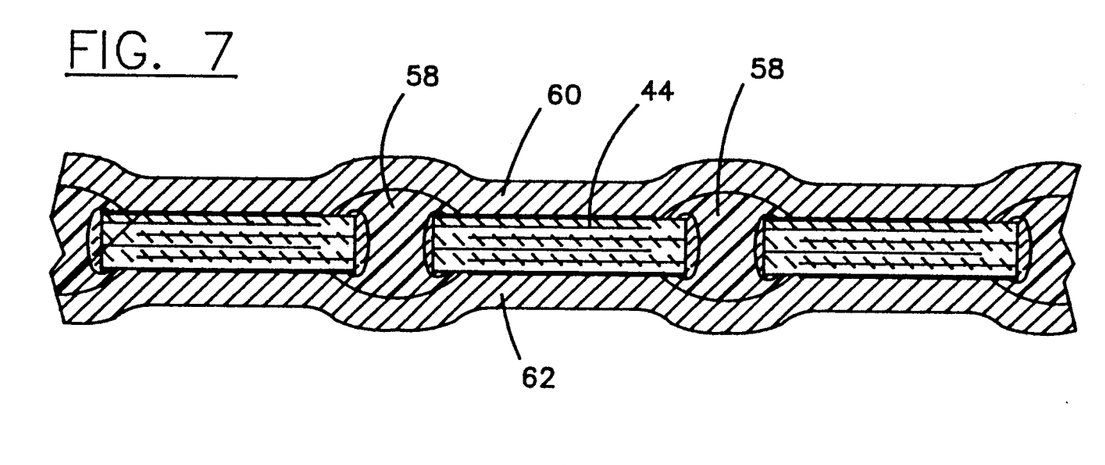
FIG. 7 is a cross-sectional elevation view similar to FIG. 6, subsequent to metallization.
Figure 8:
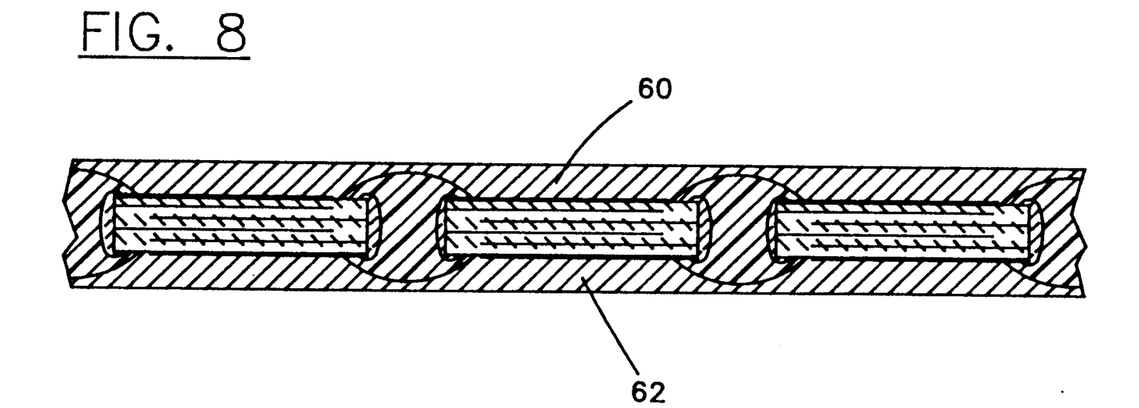
FIG. 8 is a cross-sectional elevation view similar to FIG. 7, and subsequent to additional metallization.

Still another embodiment of the present invention is shown in FIGS. 6–8. In this embodiment, rather than using high dielectric constant pellets of homogeneous composition, a multilayer capacitive element 44 is utilized. Capacitive element 44 is a known multilayer ceramic chip capacitor (such as disclosed in aforementioned U.S. Pat. Nos. 4,745,537 and 4,706,162) comprised of a plurality of metallized layers 46 with alternating layers being connected to end electrodes 48 and 50. The top and bottom surfaces of multilayer chip 44 includes exposed electrodes 52 and 54 which are also connected to opposed end electrodes 48 and 50, respectively. Finally, an insulating cap 56 is provided on each end electrode 48 and 50 to prevent shorting between an exposed top or bottom electrode 52, 54 and one of the end electrodes 48 and 50. As in the previously discussed embodiments of FIGS. 1–4, in this latter embodiment, a plurality of multilayer capacitive elements 44 are arranged in a monolayer array and a suitable polymeric adhesive 58 is used to bind the side edges of the multilayer chips 44 together. As shown in FIG. 6, this will typically result in an undulating surface between the polymer 58 and each multilayer capacitive element 44. As shown in FIG. 7, the array can then be electroless plated with copper, nickel, tin or any other suitable plating material to define thin metallized outer layers 60 and 62. Of course the undulating surface features may be eliminated by sufficiently building up the thickness of the plated electrodes and then grinding or lapping them to define a planar outer surface as in FIG. 8.

It will be appreciated that the capacitance per unit area for the FIGS. 6–8 embodiment of the present invention will depend upon the size of the chips, the number of the chips per unit area, the capacitance of individual chips and the thickness of the chips.

EXAMPLE 3

As an illustration of the levels of capacitance achievable with the embodiment of FIGS. 6–8, a flexible sheet of the type shown in FIG. 8 using multilayer capacitive elements 44 having length dimensions of 0.35", width dimensions of 0.20" and thickness dimensions of 0.018" will be discussed. The dielectric used in the capacitive element is a lead magnesium niobate dielectric wherein capacitance on an average of 1.0 micro F/chip is obtainable. Next, assuming a 0.030" gap between chips in the chip array, there would be 4.4 chips in the y direction and 3.03 chips in the x direction for a total of 13.33 chips per square inch or a total capacitance of 13.33 micro F./sq.in. This is compared to the far lower capacitance obtained from using the embodiment of FIG. 1 (see Example 1) of 0.312 micro F./sq.in.

Referring now to FIGS. 9–12, a high capacitance multilayer printed circuit board in accordance with the present invention is shown generally at 90. Circuit board 90 comprises a pair of exterior electrically insulative layers 92 and 94 which sandwich therebetween a high dielectric flexible layer 96 of the type described in detail with regard to FIGS. 1–8. Each insulative sheet 92 and 94 include circuit patterns 98 and 100 respectively thereon. As described in detail above, flexible dielectric sheet 96 comprises a planar layer of spaced ceramic chips 102 separated by a flexible polymeric material 104. Dielectric chips 102 and polymeric material 104 include a planar or otherwise deposited upper electrode 106 and lower electrode 108. Electrode layers 106 and 108 will act as the voltage and ground planes for the multilayer circuit board 90. Thus, high dielectric flexible layer 96 will function as a decoupling capacitor when a circuit component is electrically attached to board 90. This important feature of the present invention eliminates the need for discrete decoupling capacitor elements and frees valuable board space on the surface of board 90. Insulative layers 92 and 94 may comprise any suitable insulative material including well known circuit board materials FR-4, G-10, G-11 and the like.

Figure 9:
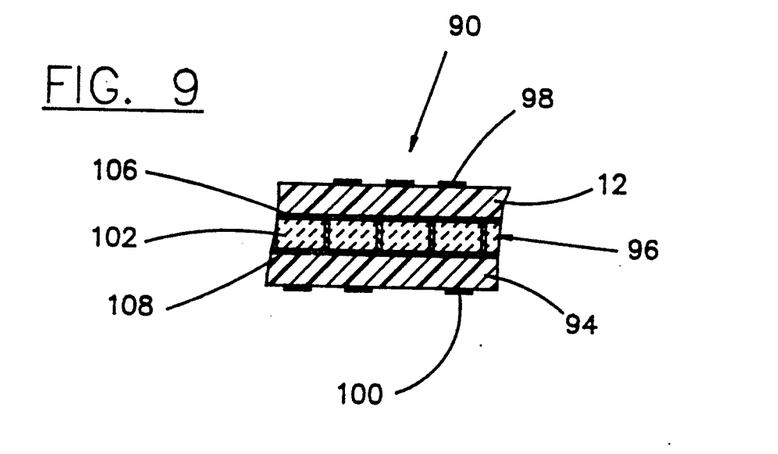
FIG. 9 is a cross-sectional partial side elevation view of the multi layer printed circuit board of the present invention.
Figure 10:
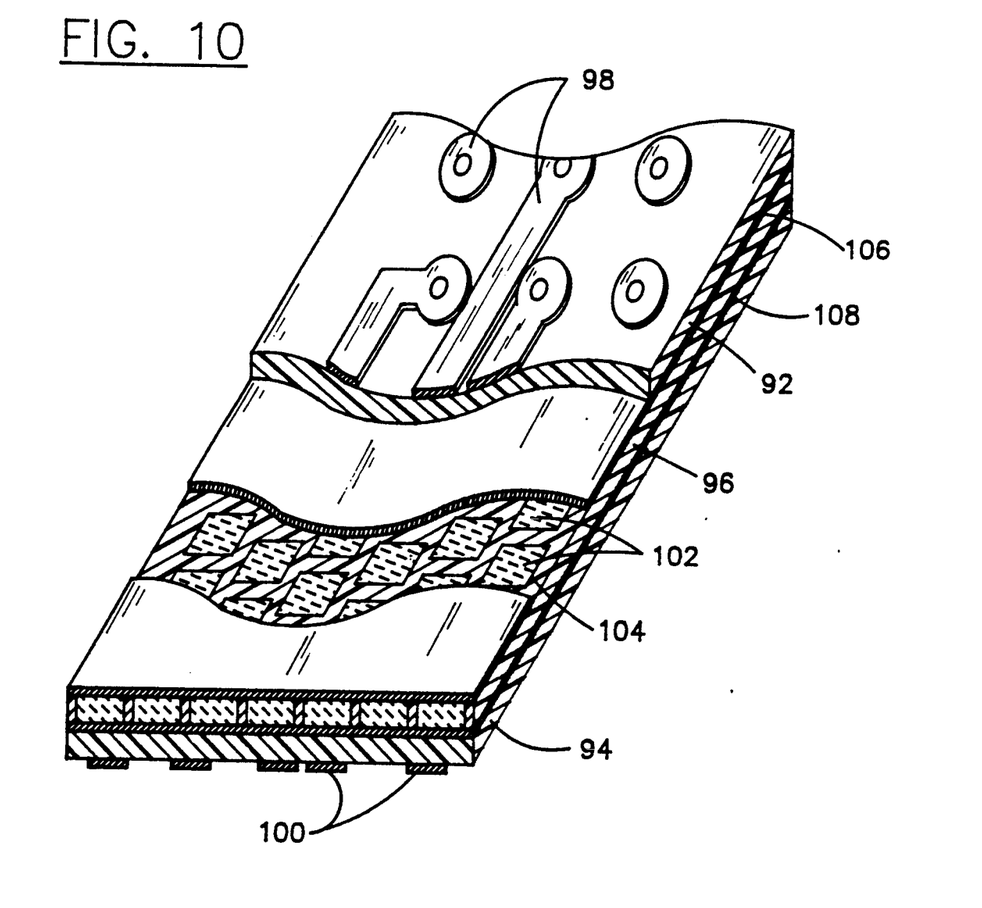
FIG. 10 is a prospective view with sections cut away of the board of FIG. 9.
Figure 11:
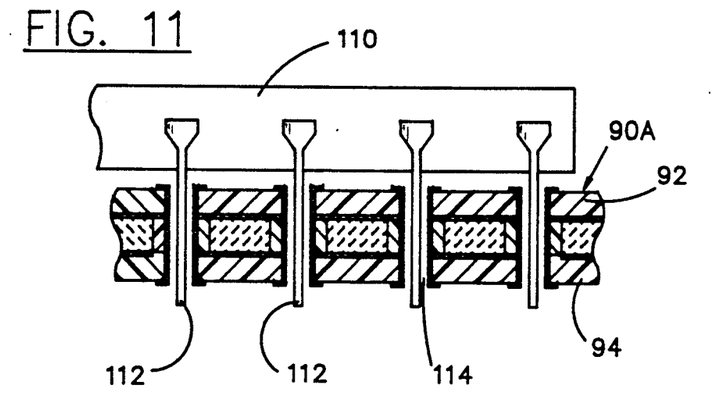
FIG. 11 is a cross-sectional partial side elevation view of the circuit board of FIG. 9 with plated through holes.

High dielectric flexible sheet 96 may be altered to fine tune physical parameters on board 90 for particular uses. Also, multiple layers of sheet may be used to provide many voltage planes and interconnections. The thickness of layers 96 may be altered to vary the capacitance of board 90. Because of the design of flexible sheet 96, the capacitance per unit area of the dielectric layer may be varied to a predetermined level. The thickness of electrodes 106 and 108 may also be varied to change the current carrying capacity of the voltage planes and the ground planes. The temperature stability of sheet 96 may also be adjusted.

In addition to simultaneously providing both power distribution and decoupling, and eliminating the need for discrete decoupling capacitors, the multilayer circuit board of the present invention provides many other advantages. Board 90 eliminates the need for expensive pick and place machinery for decoupling capacitors. It also eliminates solder quality problems inherent with decoupling capacitors. Moreover, flexible high dielectric sheet 96 makes multilayer board 90 more dense, more reliable, less costly to assemble, and also improves heat dissipation by virtue of ceramic elements 102 in the flexible dielectric layers.

The multilayer circuit board incorporating the flexible high dielectric constant sheet in accordance with the present invention may be used with either through hole technology or in surface mount applications. For example, in FIG. 11, a dual-in-line integrated circuit package 110 includes a plurality of leads 112 which are mounted in plated through holes 114 in multilayer circuit board 90A. Circuit board 90A is substantially similar to circuit board 90 of FIGS. 9 and 10 with the exception that plated through holes 114 are provided to interconnect circuit patterns 98 and 100 on the two outer surfaces of the board.

Figure 12:
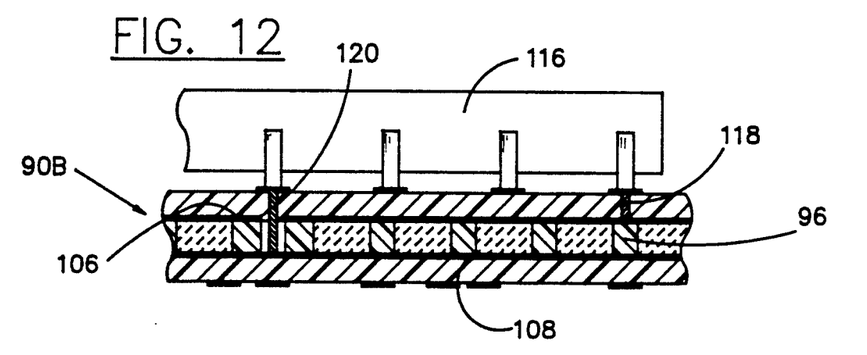
FIG. 12 is a cross-sectional of the circuit board of FIG. 9 with a surface mounted IC.

In FIG. 12, a surface mount integrated circuit package 116 is shown on a multilayer circuit board 90B wherein vias 118 and 120 have been provided to interconnect with the flexible dielectric sheet 96 within circuit board 90B. Note that a hole 122 has been drilled through flexible sheet 96 to permit attachment between the lower electrode 108 and via 120.

Figure 13:
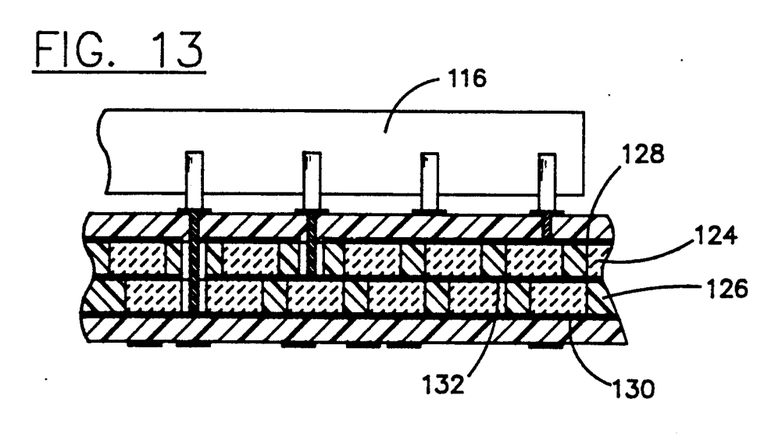
FIG. 13 is a cross-sectional elevation view of the circuit board of FIG. 9 incorporating a pair of internal high dielectric constant flexible sheets.

Turning now to FIG. 13, as mentioned, a plurality of flexible dielectric sheets 96 may be used in the multilayer circuit board of the present invention. Thus, in FIG. 13, a pair of flexible dielectric sheets 124 and 126 are mounted adjacent one another to provide a pair of outer voltage planes 128 and 130 and an inner ground plane 132. As in the embodiment of FIG. 12, holes are drilled in the flexible high dielectric sheets to provide attachment with the several voltage planes 128, 130 and ground plane 132. Of course, any number of flexible dielectric sheets may be stacked up within the circuit board so as to obtain relatively high preselected capacitance values.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A multilayer circuit board comprising:
    a first layer of insulating material having opposed first and second surfaces;
    a second layer of insulating material having opposed first and second surfaces;
    a first conductive layer on at least a portion of said first surface of said first layer of insulating material;
    a second conductive layer on at least a portion of said first surface of said second layer of insulating material;
    at least one high dielectric flexible sheet between said second surfaces of said first and second layers of insulating material, said high dielectric flexible sheet including;
    (a) an array of spaced high dielectric chips arranged in a single layer, each of said chips having side, top and bottom surfaces;
    (b) a flexible polymeric binder between said side surfaces of said chips and binding said chips to define a cohesive sheet having opposed first and second planar surfaces with said top and bottom surfaces of said chips being exposed on said respective first and second surfaces, said binder being selected from the group consisting of flexible thermoplastics and flexibilized thermosets;
    (c) a first metallized layer defining a first voltage level plane on said first planar surface; and
    (d) a second metallized layer defining a second voltage level plane on said second planar surface.

2. The board of claim 1 wherein:
    said chips comprise a sintered ceramic material.

3. The board of claim 2 wherein:
    said ceramic material is selected from the group consisting of barium titanate, lead magnesium niobate or iron tungsten niobate.

4. The board of claim 1 wherein:
    said chips have a shape which is selected from the group consisting of cylindrical, rectangular or square.

5. The board of claim 1 including:
    at least one groove formed in said chips to enhance mechanical binding with said polymeric binder.

6. The board of claim 1 wherein:
    said chips comprise multilayer capacitive elements having exposed top and bottom electrodes which electrically contact respective of said first and second metallized layers.

7. The board of claim 1 wherein:
    said first and second metallized layers are comprised of a material selected from the group consisting of copper, nickel or tin.

8. The board of claim 1 wherein:
    said high dielectric chip has a dielectric constant of at least 10,000.

9. The board of claim 1 including:
    at least one first via connecting said first conductive layer to said first voltage level plane; and
    at least one second via connecting said second conductive layer to said second voltage level plane.

10. The board of claim 9 including:
    an opening through said high dielectric flexible sheet; and
    at least one of said first or second vias passing through said opening.

11. The board of claim 1 including:
    at least one plated through hole interconnecting said first and second conductive layers, said plated through hole being out of contact with said first and second voltage level planes.

12. The board of claim 1 including:
    a plurality of adjacent high dielectric flexible sheets between said first and second layers of insulating material.

13. The board of claim 1 wherein:
    said first and second conductive layers each comprise respective first and second conductive patterns.

* * * * *